United States Patent
Jung et al.

(10) Patent No.: US 7,851,135 B2
(45) Date of Patent: Dec. 14, 2010

(54) METHOD OF FORMING AN ETCHING MASK PATTERN FROM DEVELOPED NEGATIVE AND POSITIVE PHOTORESIST LAYERS

(75) Inventors: Woo Yung Jung, Seoul (KR); Guee Hwang Sim, Gangwon-do (KR)

(73) Assignee: Hynix Semiconductor Inc., Icheon-si (KR)

( * ) Notice: Subject to any disclaimer, the term of this patent is extended or adjusted under 35 U.S.C. 154(b) by 431 days.

(21) Appl. No.: 11/948,631

(22) Filed: Nov. 30, 2007

(65) Prior Publication Data
US 2009/0142711 A1 Jun. 4, 2009

(51) Int. Cl.
G03F 7/20 (2006.01)
G03F 7/40 (2006.01)
(52) U.S. Cl. ...................... 430/312; 430/330
(58) Field of Classification Search .................. 430/312
See application file for complete search history.

(56) References Cited

U.S. PATENT DOCUMENTS

2002/0055064 A1* 5/2002 Iguchi et al. ................. 430/325

FOREIGN PATENT DOCUMENTS

| JP | 10-246959 | 9/1998 |
| KR | 1019990086370 A | 12/1999 |
| KR | 1020050002368 A | 1/2005 |
| KR | 1020070004234 A | 1/2007 |

OTHER PUBLICATIONS

KIPO machine translation of Han et al. KR-10-1999-0086370, previously cited as Foreign 2 of 4 on IDS Aug. 5, 2009.*
KIPO machine translation of Lee et al. KR-10-2007-0004234, previously cited as Foreign 4 of 4 on IDS Aug. 5, 2009.*
English translation of previously cited Lee et al. (KR 10-2007-0004234).*
English translation of previously cited Han et al. (KR 10-1999-0086370).*

* cited by examiner

*Primary Examiner*—Mark F Huff
*Assistant Examiner*—John Ruggles
(74) *Attorney, Agent, or Firm*—Townsend and Townsend and Crew LLP

(57) ABSTRACT

The present invention relates to a method of forming an etching mask pattern from developed negative and positive photoresist layers. According to the present invention, a negative photoresist layer is formed over a substrate. Some regions of the negative photoresist layer are exposed, thereby generating hydrogen ions within the exposed negative photoresist regions. The negative photoresist layer is developed so that the exposed negative photoresist regions remain. A positive photoresist layer is formed over the substrate including the remaining negative photoresist regions. The substrate is baked so that hydrogen ions within the remaining negative photoresist regions are diffused into the positive photoresist layer at boundary portions adjacent to the remaining negative photoresist regions. The positive photoresist layer is developed to remove the positive photoresist portions into which the hydrogen ions are diffused.

9 Claims, 2 Drawing Sheets

METHOD OF FORMING AN ETCHING MASK PATTERN FROM DEVELOPED NEGATIVE AND POSITIVE PHOTORESIST LAYERS

BACKGROUND OF THE INVENTION

The present invention relates to a method of forming an etching mask pattern and, more particularly, to a method of forming an etching mask pattern from developed negative and positive photoresist layers, in which it can reduce a pattern pitch through exposure and development according to a combination of a chemically amplified negative photoresist and a chemically amplified positive photoresist.

As semiconductor products are miniaturized and highly integrated, there is a growing interest in patterning technologies for forming a pattern in order to improve a new function of devices. Current patterning technologies with a high integration level have been developed as nuclear technologies of semiconductor fabrication, and a photolithography process is generally used. In this photolithography process, a photoresist (PR) (that is, a chemical material that reacts according to whether light is irradiated) is coated to form a photoresist layer. The photoresist layer is exposed and developed, thus forming an etching mask pattern. The underlying layer is selectively etched and patterned using the formed etching mask pattern.

In general, the process capability limit (resolutions) of a photoresist layer exposure equipment used at the time of patterning is represented by the half pitch, which is half the pattern pitch defined as the sum of a width of the line pattern and a width of the space adjacent to the line pattern.

The resolution of exposure equipment that has been developed so far is 45 nm on the basis of the half pitch. It is necessary to reduce the pattern pitch or the half pitch in order to increase a net die.

BRIEF SUMMARY OF THE INVENTION

The present invention is directed to form an etching mask pattern having a pattern pitch, which is half the resolution of an exposure equipment through exposure and development according to a combination of a chemically amplified negative photoresist and a chemically amplified positive photoresist.

In accordance with a method of forming an etching mask pattern from developed negative and positive photoresist layers according to the present invention, a negative photoresist layer is formed over a substrate. Some regions of the negative photoresist layer are exposed, thereby generating hydrogen ions within the exposed negative photoresist regions. The negative photoresist layer is developed so that the exposed negative photoresist regions remain. A positive photoresist layer is formed over the substrate including the remaining negative photoresist regions. The substrate is baked so that hydrogen ions within the remaining negative photoresist regions diffuse into the positive photoresist layer at boundary portions adjacent to the remaining negative photoresist regions. The positive photoresist layer is developed to remove the positive photoresist portions into which the hydrogen ions are diffused.

A Bottom Anti-Reflective Coating (BARC) layer may be further formed before the formation of the negative photoresist layer. Each of the negative photoresist layer and the positive photoresist layer may be formed using a chemically amplified photoresist.

The sum of a width of one remaining negative photoresist region and a width of a first space adjacent to the one remaining negative photoresist region may define a first pattern pitch, which is twice a resolution of an exposure equipment. The positive photoresist layer may be formed so that a thickness on a top of the remaining negative photoresist regions is thinner than a penetration thickness of the hydrogen ions, which will be diffused from the remaining negative photoresist regions into the surrounding positive photoresist layer adjacent to each side portion of the remaining negative photoresist regions, through baking. The positive photoresist layer may be formed so that a penetration thickness of the hydrogen ions diffused into a lateral portion of the positive photoresist layer is thicker than a penetration thickness of the hydrogen ions diffused on a top of the remaining negative photoresist region.

The etching mask pattern may have a second pattern pitch, which becomes a target distance by removing the positive photoresist portions including the hydrogen ions diffused from each side portion of the remaining negative photoresist region. The etching mask pattern may include the remaining negative photoresist region and remaining positive photoresist region, which are spaced apart from each other by a second space and are alternately formed.

The etching mask pattern is formed so that a sum of either a width of one of the remaining negative photoresist regions or a width of one of the remaining positive photoresist regions and a width of the second space has a same second pattern pitch as a resolution of an exposure equipment.

DESCRIPTION OF SPECIFIC EMBODIMENTS

Now, a specific embodiment according to the present invention will be described with reference to the accompanying drawings.

However, the present invention is not limited to the disclosed embodiment, but may be implemented in various manners. The embodiment is provided to complete the disclosure of the present invention and to allow those having ordinary skill in the art to understand the scope of the present invention. The present invention is defined by the category of the claims.

FIGS. 1A to 1F are sectional views illustrating an etching mask pattern from developed negative and positive photoresist layers according to an embodiment of the present invention.

Figure 1A:
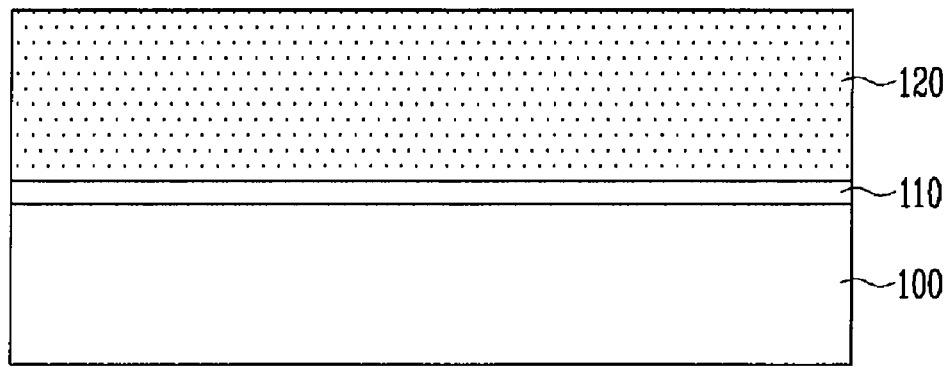
FIGS. 1A to 1F are sectional views illustrating a method of forming an etching mask pattern from developed negative and positive photoresist layers according to an embodiment of the present invention.

Referring to FIG. 1A, a Bottom Anti-Reflective Coating (BARC) layer 110 is formed on a substrate 100. The BARC layer 110 functions to control reflection light of an exposure light source, which is reflected from the surface of the substrate 100. The BARC layer 110 may not be formed, if appropriate.

A negative photoresist layer 120 is formed on the BARC layer 110. The negative photoresist layer 120 may be formed using a chemically amplified resist.

The chemically amplified resist refers to a resist having the quantum yield of 100% or more. A reaction inhibitor, including resin and a Photo Acid Generator (PAG) as integral components, may be used as the chemically amplified resist in order to improve the contrast and control solubility. The chemically amplified resist may employ a matrix resin in which part of polyhydroxystyrene (PHST) resin is substituted with a t-buthoxycarbonyl (t-BOC) radical at an appropriate ratio (n/m) in order to control solubility with respect to a developer. In this case, the negative photoresist layer 120 may be formed using a spin coating method.

Figure 1B:
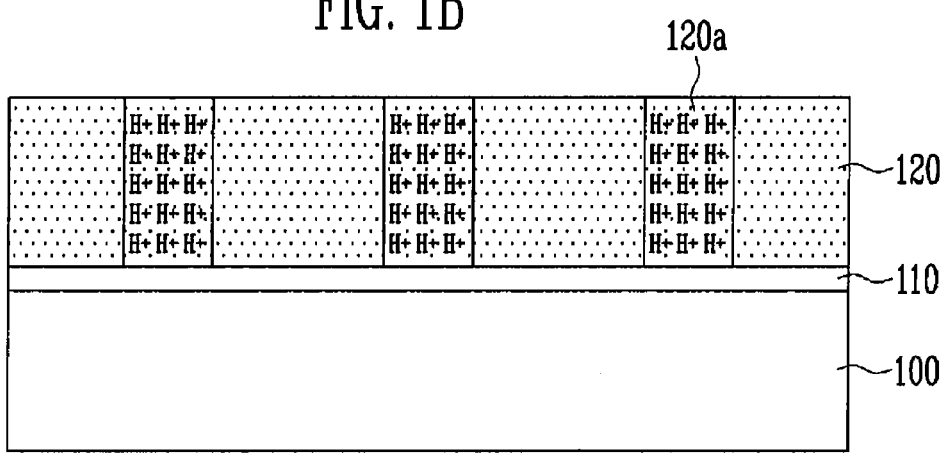

Referring to FIG. 1B, some regions of the negative photoresist layer 120 are exposed. ArF or KrF can be used as the exposure light source Thus, in exposed negative photoresist regions 120a, the hydrogen ions (H+) are generated.

In particular, according to the present invention, a pattern pitch is controlled by removing a thickness as thick as the hydrogen ions (H+), which are diffused into a positive photoresist layer (not shown) of the sidewalls of the exposed negative photoresist regions 120a through a subsequent baking process. The pattern pitch is controlled by controlling the penetration thickness of the hydrogen ions (H+) diffused into the positive photoresist layer through control of the amount of exposure.

Figure 1C:
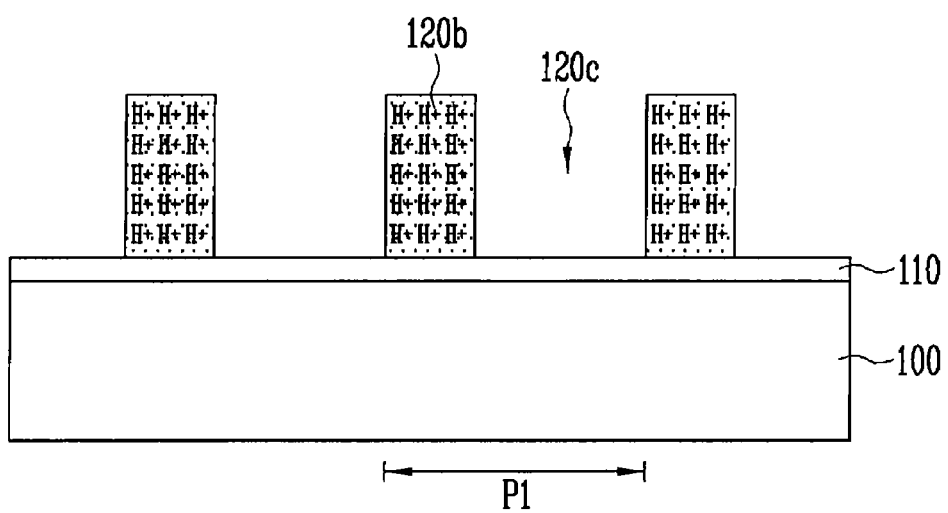

Referring to FIG. 1C, the negative photoresist layer 120 is developed. The hydrogen ions (H+) generated by exposure initiates a crosslinking reaction within the negative photoresist, so the exposed negative photoresist regions 120a remain without being dissolved in a developer. Thus, some regions 120b of the negative photoresist including the hydrogen ions (H+) (that is, a photoresist in which exposed portions remain as patterns after exposure) remain.

The sum of a width of one remaining negative photoresist region 120b and a width of a first space 120c adjacent to the one remaining negative photoresist region 120b is defined by a first pattern pitch P1, and is twice an exposure equipment resolution.

Figure 1D:
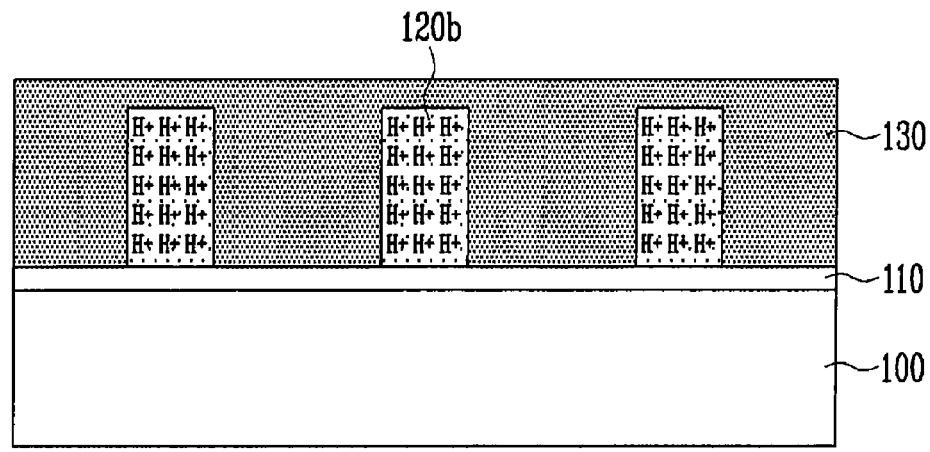

Referring to FIG. 1D, a positive photoresist layer 130 is formed over the substrate 100 including the remaining negative photoresist regions 120b. The positive photoresist layer 130 may be formed from a chemically amplified resist using a spin coating method.

The thickness of the positive photoresist layer 130 formed on top of the remaining negative photoresist regions 120b may be thinner than a penetration thickness of the hydrogen ions (H+), which is removed due to the diffusion of the hydrogen ions (H+) into the lateral sides of the positive photoresist layer 130 through a subsequent baking process, so that a developer can infiltrate below the positive photoresist layer (not shown) into which the hydrogen ions (H+) has have been diffused.

Figure 1E:
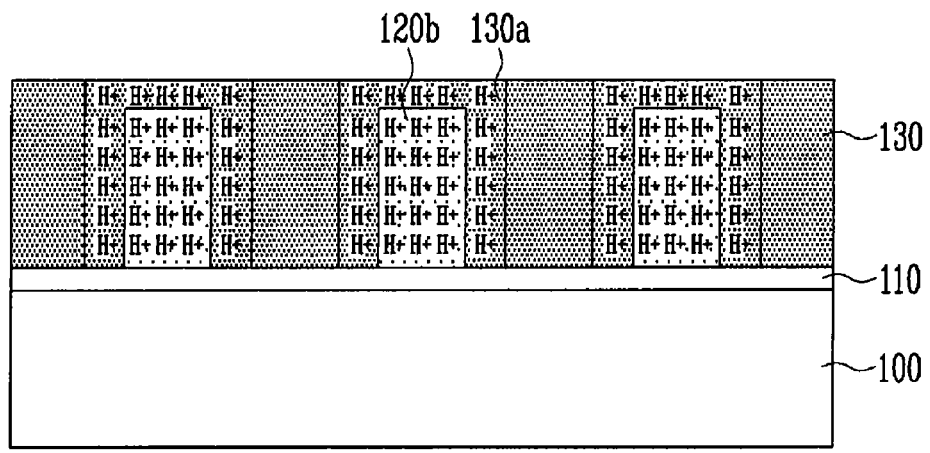

Referring to FIG. 1E, the substrate 100 over which the positive photoresist layer 130 is formed is baked. Thus, the hydrogen ions (H+) are diffused to a specific thickness on the entire surface of the remaining negative photoresist regions 120b, thus forming positive photoresist boundary portions 130a into which the hydrogen ions (H+) have been diffused. At this time, the positive photoresist boundary portions 130a into which the hydrogen ions (H+) are diffused is formed such that a thickness on the lateral side of the remaining negative photoresist region 120b is thicker than that on the top of the remaining negative photoresist region 120b.

Figure 1F:
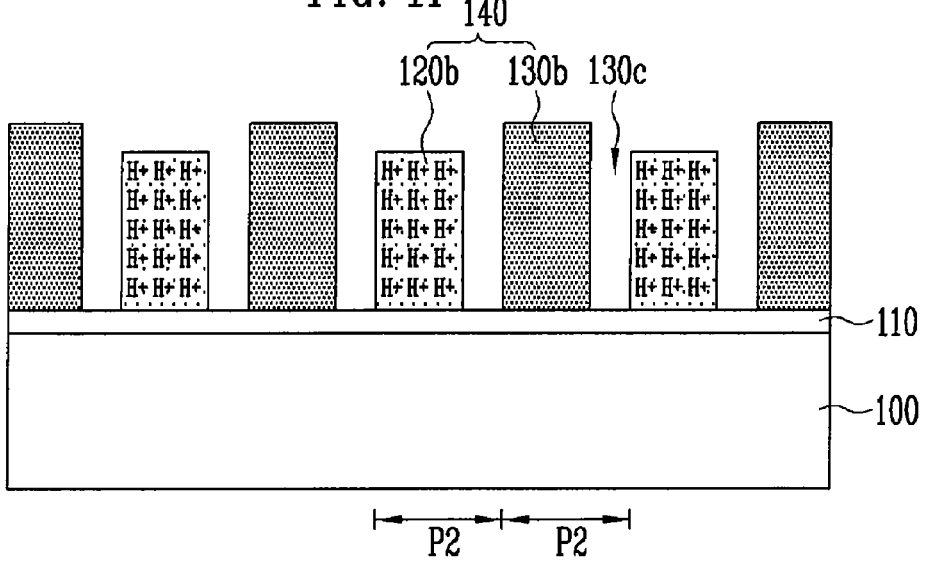

Referring to FIG. 1F, the positive photoresist layer 130 into which the hydrogen ions (H+) are diffused is selectively developed. In this case, the boundary portions of the positive photoresist layer into which the hydrogen ions (H+) are diffused are dissolved in a developer and thus removed through a decomposition reaction of the hydrogen ions (H+) within the positive photoresist. Consequently, some regions 130b of the positive photoresist layer remain.

Accordingly, an etching mask pattern 140 in which the remaining negative photoresist regions 120b, and the remaining positive photoresist regions 130b thicker than the remaining negative photoresist regions 120b are repeated alternately with them being spaced apart from each other at a second space 130c is completed. At this time, the remaining positive photoresist regions 130b are formed between the remaining negative photoresist regions 120b. Thus, the width of the second space 130c is narrower than a width of the first space 120c of FIG. 1C as much as a distance in which a width of one of the remaining positive photoresist regions 130b and a width of the second space 130c are added.

As described above, the etching mask pattern 140 has a second pattern pitch P2, which is defined as the sum of either the width of one of the remaining negative photoresist regions 120b or the width of one of the remaining positive photoresist regions 130b, and the width of the second space 130c between the remaining negative photoresist region 120b and the remaining positive photoresist region 130b. The second pattern pitch P2 becomes a target distance. Therefore, the second pattern pitch P2 of the etching mask pattern 140 according to the present invention is ½ smaller than the first pattern pitch P1, which is formed through exposure and development employing only the negative photoresist layer 120. In other words, the etching mask pattern 140 according to the present invention can implement a pattern pitch having the same distance as that of the resolution of an exposure equipment.

The etching mask pattern 140 formed as described above is used as a hard mask for forming an actual pattern, such as a gate electrode or a bit line in the semiconductor device process. Accordingly, a pattern pitch can be reduced and therefore a net die can be increased.

According to the present invention, an etching mask pattern having a pattern pitch, which is ½ smaller than that formed using only one kind of a photoresist layer in the prior art, can be formed through exposure and development according to a combination of a chemically amplified negative photoresist and a chemically amplified positive photoresist.

Further, according to the present invention, a net die can be increased by applying the mask pattern having a reduced pattern pitch to the fabrication process of semiconductor devices.

The present invention is not limited to the disclosed embodiment, but may be implemented in various manners. The embodiment is provided to complete the disclosure of the present invention and to allow those having ordinary skill in the art to understand the scope of the present invention. The present invention is defined by the category of the claims.

What is claimed is:

1. A method of forming an etching mask pattern from developed negative and positive photoresist layers, comprising:

forming a negative photoresist layer over a substrate;

exposing some regions of the negative photoresist layer, thereby generating hydrogen ions within the exposed negative photoresist regions;

developing the negative photoresist layer so that the exposed negative photoresist regions remain;

forming a positive photoresist layer over the substrate including the remaining negative photoresist regions;

baking the substrate so that hydrogen gas ions within the remaining negative photoresist regions are diffused into the positive photoresist layer at boundary portions adjacent to the remaining negative photoresist regions; and developing the positive photoresist layer to remove the positive photoresist portions into which the hydrogen ions are diffused.

2. The method of claim 1, further comprising forming a Bottom Anti-Reflective Coating (BARC) layer before the formation of the negative photoresist layer.

3. The method of claim 1, wherein each of the negative photoresist layer and the positive photoresist layer is formed using a chemically amplified photoresist.

4. The method of claim 1, wherein a sum of a width of one remaining negative photoresist region and a width of a first space adjacent to the one remaining negative photoresist region defines a first pattern pitch, which is twice a resolution of an exposure equipment.

5. The method of claim 1, wherein the positive photoresist layer is formed so that a thickness on a top of the remaining negative photoresist regions is thinner than a penetration thickness of the hydrogen ions, which will be diffused from the remaining negative photoresist regions into the surrounding positive photoresist layer adjacent to each side portion of the remaining negative photoresist regions, through baking.

6. The method of claim 1, wherein the positive photoresist layer is formed so that a penetration thickness of the hydrogen ions diffused into a lateral portion of the positive photoresist layer is thicker than a penetration thickness of the hydrogen ions diffused on a top of the remaining negative photoresist region.

7. The method of claim 1, wherein the etching mask pattern has a second pattern pitch, which becomes a target distance by removing the positive photoresist portions including the hydrogen ions diffused from each side portion of the remaining negative photoresist region.

8. The method of claim 1, wherein the etching mask pattern includes the remaining negative photoresist region and remaining positive photoresist region, which are spaced apart from each other by a second space and are alternately formed.

9. The method of claim 8, wherein the etching mask pattern is formed such that a sum of either a width of one of the remaining negative photoresist regions or a width of one of the remaining positive photoresist regions and a width of the second space has a same second pattern pitch as a resolution of an exposure equipment.

\* \* \* \* \*